United States Patent [19]

Doty

[11] Patent Number: 4,641,098
[45] Date of Patent: Feb. 3, 1987

[54] PARALLEL SINGLE TURN SADDLE RESONATOR FOR NUCLEAR MAGNETIC RESONANCE SIGNAL RECEPTION

[75] Inventor: Francis D. Doty, Columbia, S.C.
[73] Assignee: Doty Scientific, Inc., Columbia, S.C.
[21] Appl. No.: 712,080
[22] Filed: Mar. 15, 1985
[51] Int. Cl.[4] .............................................. G01R 33/20
[52] U.S. Cl. ...................................... 324/322; 324/318
[58] Field of Search .............. 324/300, 307, 316, 318, 324/322

[56] References Cited

U.S. PATENT DOCUMENTS

| | | | |
|---|---|---|---|
| 3,771,055 | 11/1973 | Anderson | 324/307 |
| 4,408,162 | 10/1983 | Egger | 324/318 |
| 4,435,680 | 3/1984 | Froncisz | 324/316 |
| 4,439,733 | 3/1984 | Hinshaw et al. | 324/322 |
| 4,446,431 | 5/1984 | McKay | 324/318 |
| 4,463,328 | 7/1984 | Doty | 333/222 |
| 4,563,648 | 1/1986 | Hill | 324/318 |

Primary Examiner—Michael J. Tokar

[57] ABSTRACT

The capacitively shortened slotted line resonator or single turn saddle coil, as used in nuclear magnetic resonance signal reception, is modified by forming two axial slots from one end nearly to the opposite end through the center of the axial conductor bands. The resulting parallel arrangement of two inductor saddle loops is essentially transparent to rf magnetic fields orthogonal to its own rf magnetic field direction and orthogonal to the axis of the resonator, which allows for higher efficiency and sensitivity when two orthogonal saddle coils are employed in double resonance NMR experiments.

2 Claims, 7 Drawing Figures

PARALLEL SINGLE TURN SADDLE RESONATOR FOR NUCLEAR MAGNETIC RESONANCE SIGNAL RECEPTION

BACKGROUND OF THE INVENTION

This invention pertains to improving the decoupling efficiency and sensitivity of nuclear magnetic double resonance experiments by means of a novel saddle coil arrangement analogous to the capacitively shortened slotted line resonator. Heretofore, capacitively shortened slotted line resonators have been described by Schneider and Dullenkopf (Rev. Sci. Instr., 1977), Hoult (Prog. in NMR Spect., 1978), and Doty (Doct. Diss., 1983). Similar resonators are in wide-spread useage for high field $^1H$, $^3H$, and $^{19}F$ decoupling and observation. More recently, they have been applied to imaging of large objects at lower fields. They are sometimes called single turn saddle coils, and sometimes are referred to as decoupling coils. These resonators are often double tuned, by means of additional coils, to a second resonant frequency. A more detailed analysis of double tuned circuits for NMR signal reception may be found in the references.

The resonator will be referred to as a single-turn resonator where n in the following equation is approximately equal to unity.

$$V \simeq n \int d\phi_\perp / dt$$

where V is the magnitude of the largest voltage induced anywhere in the circuit by the time dependent normal magnetic flux, $d\phi_\perp/dt$, linking the loops.

PRIOR ART

An application of orthogonal coils for NMR is described by Anderson, U.S. Pat. No. 3,771,055. A method, albeit of very limited applicability, for reducing the magnetic dipole interactions between imperfectly aligned orthogonal coils, is described by Egger, U.S. Pat. No. 4,408,162. A rather inefficient method of double tuning by means of a $\lambda/2$ transmission line is described by McKay, U.S. Pat. No. 4,446,431. A difficult to construct coaxial resonator, suitable for very lossy samples, is described in one of my earlier patents, U.S. Pat. No. 4,463,328.

The four turn saddle coil shown in FIG. 1 is typical of that used in observing NMR resonances in 10 mm samples in superconducting solenoidal magnets over the range of 40 MHz to 120 MHz. The mean angle $\alpha$ subtended by the conductor loops is about 120°. Its rf magnetic field $B_1$ is substantially orthogonal to the static field $B_0$ as shown. The axial length in the older art was generally comparable to the diameter. In the more recent art, the axial length is generally about 1.5 to 2 times the diameter of the coil form.

The NMR sensitivity of the coil is proportional to the square root of the product of the quality factor Q and the filling factor n. Resolution and relaxation requirements place constraints on the $B_0$ and $B_1$ magnetic field homogeneities. Hence, optimized designs generally use thin, high purity copper foil for the conductors such that the total width, x, of each of the four groups of vertical conductors is about ⅛ of the circumference of the coil form. Maximizing the rf filling factor requires minimizing the coil size, while accomodating the sample, and minimizing the ratio of lead inductance to total inductance, which is difficult with low inductance coils. Maximizing the Q requires minimizing resistive coil losses and dielectric losses in the sample, which is difficult with high inductance coils. Hence, there is an optimum inductance which depends on frequency, size, and layout of tuning elements.

The capacitively shortened slotted line resonator shown in FIG. 2 is typical of the prior art for resonance above 250 MHz for 10 mm samples. It is also used in imaging of large objects at much lower frequencies. Because of the extremely low inductance of this resonator, the capacitors 1 must be of the low inductance and low resistance chip type, and one must be mounted directly across each break 2 in the conductor arcs 3 in the base of the resonator to raise the impedance and reduce the resonant current in the leads 4. The capacitors 1 inserted here are usually less than that required to resonate the circuit at the desired frequency so as to permit external capacitive fine tuning and matching.

For higher frequencies and larger volumes, additional breaks 5 in the opposite conductor arcs 6 are formed to allow the insertion of additional balancing capacitors 7 as shown in FIG. 3. The resulting quadrapolar resonator has reduced stray electric fields and hence reduced dielectric losses in the sample.

Both of the above slotted line resonators may be thought of as high frequency limits of the saddle coil, in that a single turn, with one or more breaks in the conductor path for resonating capacitors, is used to generate rf magnetic fields orthogonal to the axis of a cylinder. In optimum single resonance applications, the width C of each of the two axial conductor bands 8 is comparable to each of the two window widths W. The window length L is generally 1.5 to 2 times the form diameter D. The width of the base and top arcs is often 1.5C.

FIG. 4 illustrates the typical prior art for generating two mutually orthogonal rf fields in a sample at two widely differing frequencies in a high field superconducting magnet. The outer slotted resonator is usually turn to $^1H$. The inner four-turn saddle coil is tuned to a lower frequency nuclide of interest, X. Additionally, one or both of these resonators may be double or even triple tuned by means of additional external coils to permit simultaneous decoupling of another nuclide and/or magnetic field locking on another nuclide and/or cross polarization.

The interaction between these orthogonal resonators is not negligible and must be considered in the design. Electric field interactions are nulled by balancing both circuits with respect to ground. Magnetic dipole interactions are nulled by a careful, experimental determination of actual azimuthal orthogonality. However, high order interactions still result in substantial losses. The rf field of the inner saddle coil induces strong eddy currents in the vertical conductor bands of the outer slotted-line resonator, which decreases the inductance, the quality factor, and the rf magnetic field strength of the saddle coil. It is usually desirable to maximize sensitivity of the "observe" frequency at the expense of a considerable loss in high frequency decoupling efficiency and lock sensitivity. Hence, the typical high-field high-resolution $^1H$—X—$^2H$ probe uses an optimized single-tuned saddle coil very close to the size of the sample tube for the "observe" nuclide, X, with an oversized, double-tuned slotted line resonator for $^1H$ decoupling and $^2H$ lock. Moreover, the width of the conductor bands is generally made about half as wide as would be optimum for $^1H$. By so doing, the interaction between the coils is substantially reduced, thereby allowing high X sensitivity at the expense of perhaps a 75% reduction in decoupling efficiency and lock sensitivity.

One object of the present invention is to provide a method of achieving much higher efficiency and sensitivity in decoupling and locking without sacrificing observe sensitivity.

SUMMARY OF THE INVENTION

The present invention provides increased efficiency and sensitivity in double resonance NMR experiments where at least one slotted line resonator is employed by modifying the resonator in such a way as to make it more transparent to the rf magnetic field of a second orthogonal saddle type resonator, thereby increasing its inductance, Q, and rf magnetic field strength.

The slotted line resonator is modified by forming two additional axial slots from one end nearly to the opposite end through the center of the axial conductor bands which are joined in pairs by conductor arcs at each end, with the arcs at at least one end broken to allow the insertion of resonating capacitors. The resulting parallel single turn saddle resonator is essentially transparent to rf magnetic fields orthogonal to its own rf magnetic field direction and orthogonal to the axis of the resonator.

DETAILED DESCRIPTION OF THE PREFERRED EMBODIMENT

Figure 1:
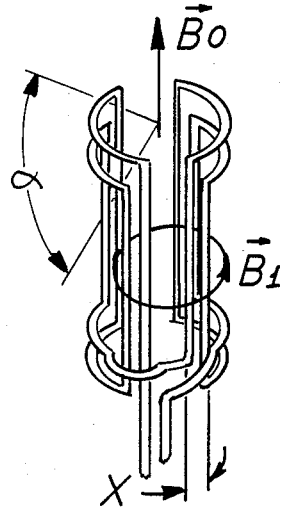
FIG. 1 shows a typical four-turn saddle coil according to the prior art.
Figure 2:
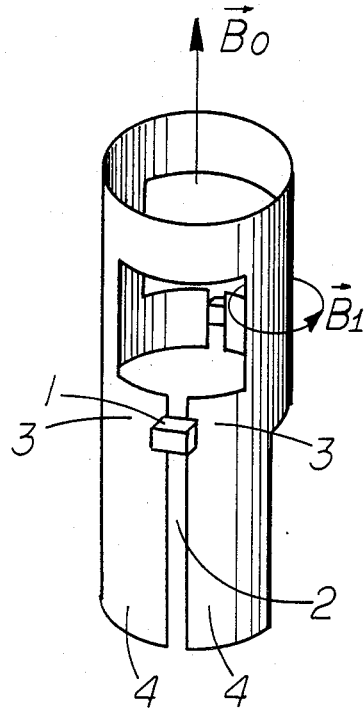
FIG. 2 shows a capacitively shortened slotted line resonator according to the prior art.
Figure 3:
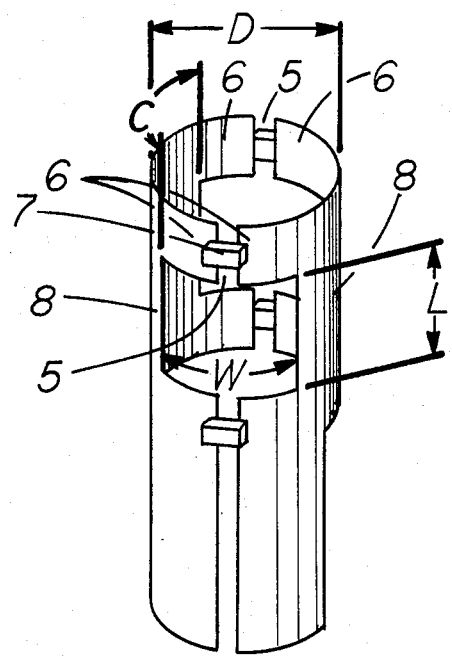
FIG. 3 shows a quadrapolar slotted line resonator according to the prior art.
Figure 4:
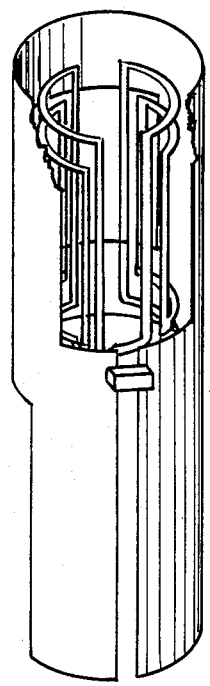
FIG. 4 depicts a four-turn saddle coil inside a capacitively-shortened slotted-line resonator according to the prior art.
Figure 5:
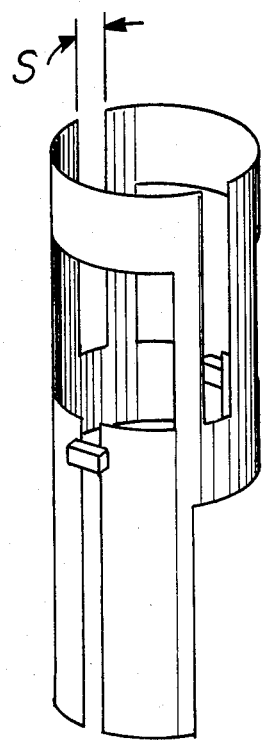
FIG. 5 illustrates the parallel single turn saddle resonator of the present invention.

FIG. 5 illustrates the parallel single-turn resonator of the present invention. A slot is cut into each vertical conductor band to interrupt the path of the induced eddy currents. The result is two parallel single-turn saddle inductor loops, with resonating capacitors, connected in parallel at two points. This greatly reduces the magnetic interaction between concentric orthogonal coils, thus permitting a much closer spacing between such coils and higher filling factor for the outer coil. In most cases a slot width S of one sixth the diameter, with axial conductor band widths of one third the diameter, is desirable for generating high homogeneity rf fields at high efficiency with very little degradation in the sensitivity of the inner coil. However, at higher frequencies or with larger samples, it is often desirable to increase the slot width and reduce the conductor band width to further reduce the interaction between two concentric coils.

Figure 6:
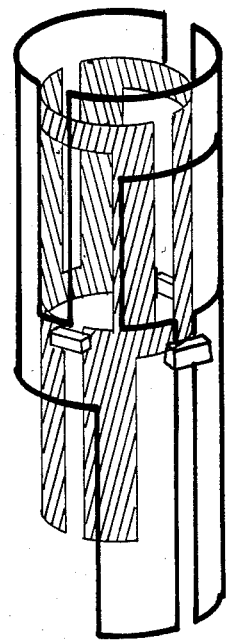
FIG. 6 illustrates two orthogonal dual parallel single turn saddle resonators.

In double resonance experiments involving two nuclides of high and nearly equal magnetogyric ratio such as $^1H$ and $^{19}F$ or $^1H$ and $^3H$, the present invention may be used to great advantage at both frequencies as shown in FIG. 6. The reduced magnetic interaction improves sensitivity and efficiency at both frequencies and improves isolation between the frequencies. This is also particularly advantageous with the quadrature detection technique employing two similar, orthogonal resonators at the same frequency.

Figure 7:
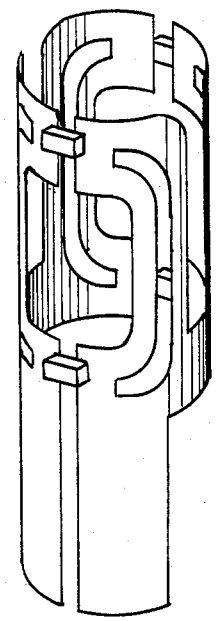
FIG. 7 illustrates several modifications of the parallel single turn saddle resonator suitable for very large samples at very high frequencies.

The performance at very high frequencies for very large samples is further improved by adding the quadrapolar modification as illustrated in FIG. 7. Some additional enhancement in magnetic isolation may be achieved by using several inductor loops in parallel on each side of the cylindrical form or by adding additional slits colinear with the resonant current path in the axial conductor bands and/or the transverse arcs as shown.

This invention has been shown with reference to a preferred embodiment thereof. Variations and modifications will be apparent to persons skilled in the art. All such variations are intended to be within the scope of the present invention as defined in the following claims.

I claim:

1. A parallel single turn saddle resonator for inducing or detecting transverse nuclear magnetization in a sample, said resonator comprising an even number of inductor loops, said loops formed to the contour of one or more substantially concentric cylindrical surfaces and located symmetrically on at least one axis of a pair of mutually orthogonal axes which intersect orthogonally the axis of said cylindrical surface(s) at a given point, said loops on a given axis all electrically connected in parallel by suitable coupling means, and each loop including at least one break for the insertion of a capacitor.

2. A resonator as in 1 above in which said loops have one or more slits colinear with the resonant current path.

* * * * *